United States Patent [19]

Dieterich

[11] Patent Number: 5,767,746
[45] Date of Patent: Jun. 16, 1998

[54] METHOD AND APPARATUS FOR ADJUSTING PHASE-LOCK-LOOP PARAMETERS

[75] Inventor: Charles Benjamin Dieterich, Kingston, N.J.

[73] Assignee: David Sarnoff Research Center, Inc., Princeton, N.J.

[21] Appl. No.: 660,300

[22] Filed: Jun. 7, 1996

[51] Int. Cl.⁶ .................................................. H03L 7/197
[52] U.S. Cl. ........................ 331/17; 331/10; 327/156; 327/158; 375/376
[58] Field of Search ........................ 331/10, 11, 17; 375/324, 376; 327/156, 158, 31, 35

[56] References Cited

U.S. PATENT DOCUMENTS 5,315,270 5/1994 Leonowich ........................ 331/1 A
5,467,342 11/1995 Logston et al. ........................ 370/17

*Primary Examiner*—Timothy P. Callahan
*Assistant Examiner*—An T. Luu
*Attorney, Agent, or Firm*—William J. Burke

[57] ABSTRACT

A method and apparatus for adjusting the parameters of a PLL in a communication system. The method measures the rate of transmission of clock reference information by measuring the time of arrival of successive clock references or the difference of the clock reference values. The method applies the measured transmission rate to a plurality of predefined transmission rate ranges to acquire the proper gain factor values. These gain factor values are used to control the responsiveness of the PLL to new clock reference information.

16 Claims, 3 Drawing Sheets

METHOD AND APPARATUS FOR ADJUSTING PHASE-LOCK-LOOP PARAMETERS

The present invention relates to an apparatus and concomitant method for adjusting Phase-Lock-Loop (PLL) parameters in a communication system. More particularly, this invention relates to a method and apparatus that evaluates the rate of transmission of clock reference information from a data stream to adjust the gain of a PLL in a decoder or retransmission equipment.

BACKGROUND OF THE INVENTION

The increasing demand for digital video/audio information presents an ever increasing problem of monitoring and controlling the transmission or storage of data in a communication system. As the volume of data transmission increases in response to greater demand, it becomes increasingly more difficult to monitor and synchronize the enormous amount of transmitted information.

Generally, the data streams (bitstreams) contain video, audio, timing information and control data which are packaged and transmitted as a composite whole. The data, control elements, timing information and other information are arranged in various specific formats. Examples of such formats are disclosed in the ISO/IEC international Standards 11172 (1994) (generally referred to as MPEG-1) and 13818 (Jan. 20, 1995 draft) (generally referred to as MPEG-2), which are incorporated herein in their entirety by reference.

An important component of the data stream is the timing information which is used to synchronize the decoding and presentation of the video and audio data. For example, MPEG defines timing information in terms of time stamps or clock references, e.g., "System Clock Reference" (SCR) and "Program Clock Reference" (PCR), which indicate the time of a specific action such as the arrival of a byte or the presentation of a presentation unit, e.g., a decoded picture or a decoded audio frame. However, time stamps can be transmitted at a number of different rates which vary from hundreds per second to one every 0.7 seconds. The MPEG standards permit an encoder to selectively adjust the transmission rate of time stamps in performing its encoding function. One restriction is that the time interval between time stamps must not exceed a certain range, e.g., 0.7 seconds for the maximum difference between coded presentation time stamps referring to each video or audio stream. Unfortunately, the transmission of time stamps at a variable rate creates a significant problem where the time stamps are used to control a PLL of a decoder or a retransmission equipment.

The PLL is an electronic circuit that detects the frequency of an input signal and causes a Voltage-Controlled Oscillator (VCO) to match or to lock its output frequency to that of the input signal to effect synchronization. However, PLLs are usually designed to operate on an analog signal or on a constant sample rate discrete time signal. With such continuous or uniformly sampled systems, it is easy to calculate the shift in frequency by evaluating the shift in phase with the elapsed time, where time progresses at a constant speed.

However, since time stamps are transmitted at a variable rate in a non-uniformly sampled system, the VCO is vulnerable to "jerky" lock-in or "sluggish" lock-in and "under-damped" lock-in if the time stamps are received too close together or too far apart or respectively. Namely, without knowing when the last time stamp was transmitted, it is difficult to ascertain the significance of a phase slip, e.g., a frequency which causes a phase slip of one cycle within 0.001 seconds (significant frequency shift) as compared to one cycle within ten hours (relatively insignificant frequency shift).

Thus, each individual time stamp is generally tempered with a gain, thereby reducing the individual effect of each time stamp to prevent over adjustment of the VCO. The combination of this averaging effect with a large time interval between successive time stamps may require many cycles before the output frequency of the VCO is properly synchronized with the encoder, i.e., the synchronization of the clock in the decoder with the clock of the encoder.

Furthermore, another effect of transmitting time stamps at a variable rate is a varying reference frequency, which may cause color shifts in the video data, sudden shifting or "jerking" in the presentation of video data and/or speeding up or slowing down in the presentation of audio data. Namely, the clock frequency of the decoder is, in turn, used for other functions or by another device, e.g., the measure of time to extract a picture from the decoder input buffer or the color burst frequency of a television set. To illustrate, if the decoder clock is significantly behind the encoder clock, the decoder may extract the data from its input buffer in a delayed manner resulting in an overflow condition. Similarly, if the decoder frequency is shifted too far, the oscillator in the television set may not be able to lock-in to the decoder frequency, thereby making color burst in the wrong frequency.

Therefore, a need exists in the art for a method and apparatus for adjusting Phase-Lock-Loop parameters in a communication system. Specifically, a need exists for a method and apparatus for evaluating clock reference information from a data stream to adjust the gain of a PLL in a decoder or retransmission equipment for a non-uniformly sampled system.

SUMMARY OF THE INVENTION

The present invention is a method and apparatus for adjusting the parameters of a PLL in a communication system. The method measures the rate of transmission of clock reference information or compares the values in the clock reference information in a data stream to determine the appropriate adjustments to the PLL.

More specifically, data streams contain a payload of video and audio data along with clock reference information which is extracted by a decoder or retransmission equipment to synchronize the presentations of the video and audio data. Since the rate of transmission of clock reference information is variable, the gains of the PLL within the decoder must be adjusted to adapt the PLL to the varying rate.

The method measures the rate of transmission of clock reference information ($\Delta CR$) by measuring the time of arrival of successive clock references (time stamps) or the difference of the values of the time stamps. The method applies the measured $\Delta CR$ to a plurality of predefined $\Delta CR$ ranges to acquire the proper gain factor values. Finally, these gain factor values are used to control the responsiveness of the PLL to new clock reference information.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
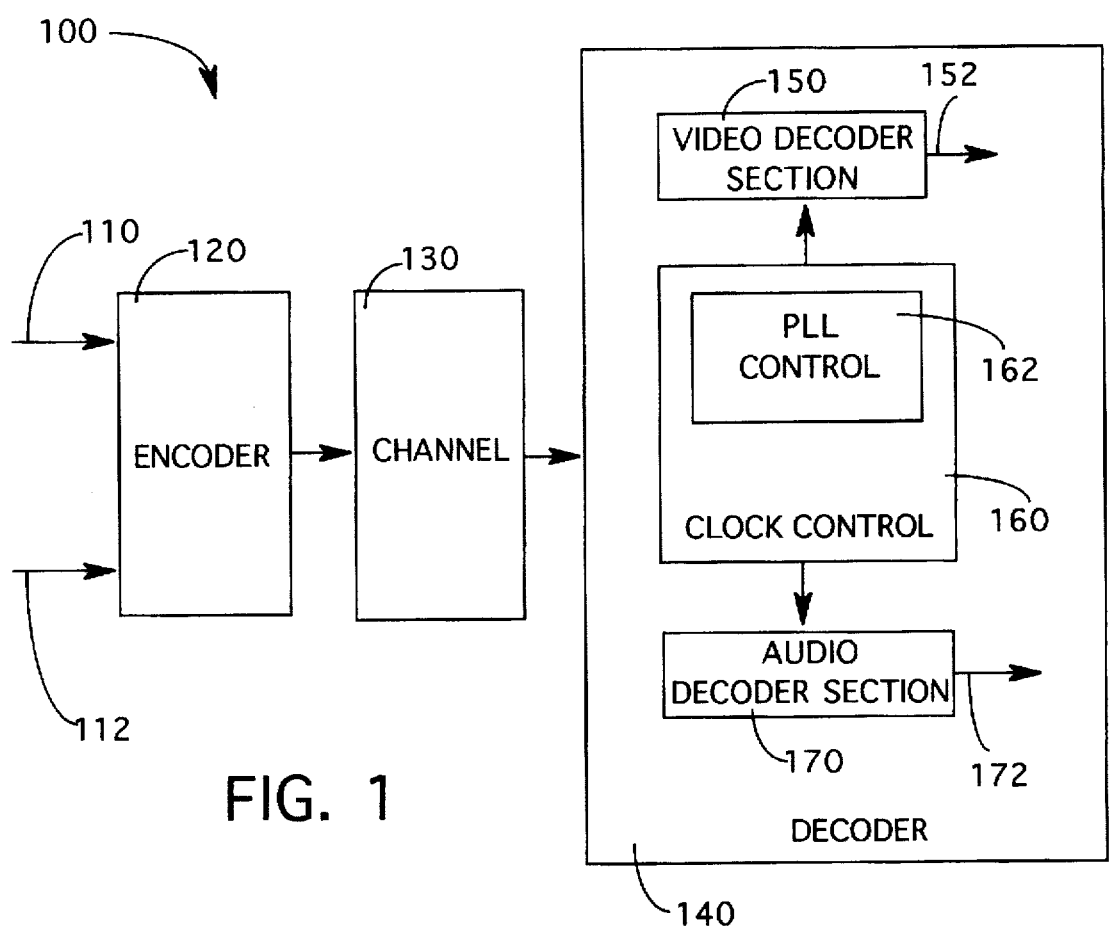
FIG. 1 illustrates a block diagram of a simplified communication system having a PLL control of the present invention.

FIG. 1 depicts a block diagram of a simplified structure of a communication system 100 having a PLL control of the present invention. Although the present invention is described below using the MPEG "transport stream" as an example, those skilled in the art will realize that the present invention can be applied to any packet streams, i.e., a MPEG "program stream" or any other packet streams in accordance with other formats. As such, the present invention is described below with reference only to the PCR. However, those skilled in the art will realize that the synchronization of a decoding system (a decoder) is achieved through the use of the SCR in the program stream and PCR in the transport stream.

System 100 includes an encoder 120 for receiving and encoding video data 110 and audio data 112 into elementary video and audio bitstreams. These bitstreams are sent to packetizers (not shown) where the elementary bitstreams are converted into packets. The packets are received and multiplexed to produce a transport stream. Packets constructed from elementary streams that form a program generally share a common time base. Thus, the transport stream may contain one or more programs with one or more independent time bases, where the time bases are used for synchronized presentation. The time bases of different programs within a transport stream may be different. In accordance with the MPEG standards, time bases are established through the use of time stamps such as PCRs and SCRs. The values and locations of PCR and SCR fields define the transport and program stream rates respectively.

The transport stream is transmitted over a transmission channel 130, which may further incorporate separate channel specific encoder and decoder (not shown). Next, the transport stream is demultiplexed and decoded by a transport stream demultiplexor (not shown), where the elementary streams serve as inputs to a decoder 140. The decoder 140 comprises a video decoder section 150 and an audio decoder section 170, whose outputs are decoded video signals on path 152 and audio signals on path 172 respectively.

Furthermore, timing information is also extracted by the transport stream demultiplexor and delivered to clock control 160 for synchronizing the video decoder section 150 and the audio decoder section 170 with each other and with the channel 130. Although the clock control 160, the video decoder section 150 and audio decoder section 170 are illustrated within decoder 140, those skilled in the art will realize that each section can be physically implemented as a separate device.

Synchronization of the decoder sections with the channel is accomplished through the use of the PCR in the transport stream. The PCR is a time stamp encoding the timing of the bitstream itself and is used to derive the decoder timing. More specifically, clock control 160 incorporates a PLL control 162 which evaluates the PCR to effect adjustment of a VCO, thereby achieving synchronization.

Figure 2:
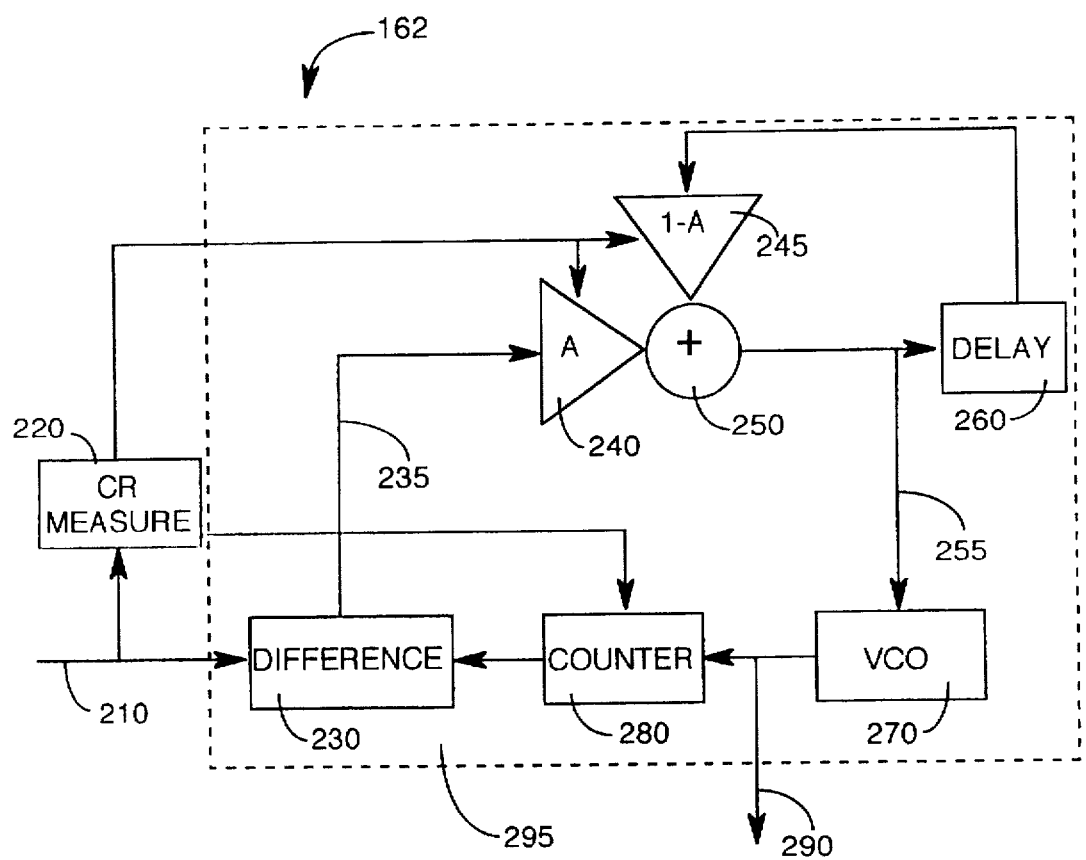
FIG. 2 illustrates a detailed block diagram of the PLL control of FIG. 1.

FIG. 2 illustrates a block diagram of the PLL control 162 of the present invention for evaluating the PCR to synchronize the decoder 140. The PLL control 162 comprises a clock reference (CR) measure 220 and a PLL 295, where the PLL comprises a difference section 230, a counter 280, a VCO 270, a delay 260, an adder 250 and gain sections 240 and 245.

A PCR is forwarded on signal connection 210 to both the CR measure 220 and the PLL 295. If the PCR is the first time stamp received by the PLL, it is used to reload or initialize the counter 280. Namely, the initialization sets the value in the counter 280 of the decoder 140 equal to that of the value of the counter (not shown) of the encoder. Thus, if the frequency of the decoder is synchronized with the encoder, both counters should count synchronously.

After initialization of the counter 280, the next PCR is evaluated to determine whether the clock frequency of the decoder needs to be adjusted. The PCR is received by the difference section 230 where it is compared with the current value from the counter 280. The difference in the two values (delta time) is forwarded via signal connection 235 to gain section 240 having a gain factor of "A". The gain factor "A" is multiplied to the delta time to reduce the effect of any particular delta time measurement on the control signal of the VCO 270.

The output of gain section 240 is added via adder 250 to the output of gain section 245 having a gain factor of "1-A". The input to gain section 245 is the previous VCO control signal as received from the delay 260. Effectively, the VCO control signal as applied through signal connection 255 is the sum of two products, i.e., the product of gain factor "A" and the current delta time and the product of gain factor "1-A" and the previous VCO control signal. Thus, instead of applying the entire effect of each delta time measurement to the VCO control signal, an aggregate or an average of a number of delta time measurements is applied to produce the VCO control signal, thereby producing a slowly varying output frequency from the VCO. This gradual change in the output frequency from the VCO is important in certain applications such as the operation of a NTSC (National Television Systems Committee) signal generator (not shown) via signal connection 290 from the VCO. Sudden frequency changes in this application may cause sudden chrominance shifts in the output pictures, i.e., where the output picture may suddenly exhibit a noticeable color change.

In the preferred embodiment, the gain factors "A" and "1-A" are not fixed to specific values. These gain factors are adjusted by the CR measure 220 in accordance with the time of arrival of successive PCRs or the difference of the values of these time stamps. The adjustment to the gain factors is necessary to maintain the filtering effect of the feedback loop (illustrated by the loop of delay 260 and gain section 245).

To illustrate, if four (4) PCRs are received in rapid succession by the PLL control 162 with gain factor "A" set to a value of 0.25, each delta time measurement will be applied to the VCO in a 25:75 proportion. Namely, the VCO control signal 255 is derived from the sum of 25% of the current delta time and 75% of the previous VCO control signal. Since the four PCRs are received in rapid succession, the PCR values and the resulting four delta time measurements should be very close in value because counter 280 would not have advanced significantly. As such, the VCO control signal is equivalent to approximately 70% of the delta time measurement from the four PCRs, thereby causing the feedback loop to lose its averaging effect. If "x" denotes the contribution of the previous VCO control signals on the output of gain section 245, then the contribution rapidly decreases to "$(.75)^4 x$" by the fourth delta time measurement. In fact, if ten (10) PCRs are received in rapid succession with gain factor "A" set to a value of 0.25, VCO control signal is equivalent to approximately 95% of the delta time measurement. In essence, the contribution to the VCO control signal from the value stored in delay 260 before the reception of the four PCRs decreases rapidly, thereby permitting the four rapid succession of PCRs to have a significant and sudden effect on the VCO control signal.

However, if gain factor "A" is set to a value of 0.0625, then the rapid succession of four PCRs will not have a significant effect on the VCO control signal. The VCO control signal is equivalent to only approximately 23% of the delta time measurement from the four PCRs, thereby maintaining the averaging effect of the feedback loop. Unfortunately, setting "A" at such a low value will expose the PLL to sluggish lock-in if the PCRs are transmitted over a large time interval. The PLL control 162 will be too slow to converge if the clock reference only occurs every 0.7 seconds. Thus, it is necessary to adjust the gain factor "A" in accordance with the time of arrival of successive PCRs or the difference of the values of these time stamps to obtain optimal performance from the PLL.

The CR measure 220 receives the PCRs from signal connection 210 and measures the time interval ($\Delta CR$) between successive PCRs. Alternatively, CR measure 220 can compute $\Delta CR$ from the difference of the PCR values. The computed $\Delta CR$ is then applied to determine the appropriate value for gain factor "A". In the preferred embodiment, a plurality of $\Delta CR$ ranges or levels and their corresponding gain factor values are predefined as illustrated in Table 1 below.

TABLE 1

| $\Delta CR$ RANGES | GAIN FACTOR "A" VALUES | GAIN FACTOR "1-A" VALUES |
| --- | --- | --- |
| $\Delta CR < 0$ | reload counter with PCR value | reload counter with PCR value |
| $\Delta CR <$ 0.1 sec. | 0.0625 | 0.9375 |
| $\Delta CR <$ 0.7 sec. | 0.25 | 0.75 |
| $\Delta CR >$ 0.7 sec. | reload counter with PCR value | reload counter with PCR value |

If CR measure 220 determines that $\Delta CR$ is less than zero (0) seconds, then counter 280 is initialized and loaded with the current PCR value. Since it is erroneous that $\Delta CR$ should reflect a negative time, a discontinuity or an error has occurred and the decoder counter is reinitialized with the most recent PCR value.

Similarly, if $\Delta CR$ is greater than 0.7 seconds, then counter 280 is also initialized and loaded with the current clock reference value. Since it is prohibited under the MPEG standards that successive clock references be transmitted greater that a time interval of 0.7 seconds, an error has occurred and the decoder counter is reinitialized.

However, those skilled in the art will realize that other formats or different types of clock references may have different time interval limitations. Thus, the upper $\Delta CR$ range can be modified to reflect such differences. Furthermore, the numbers of $\Delta CR$ ranges and the gain factor values can be modified to reflect the requirements of a specific application. Increasing the numbers of $\Delta CR$ ranges will likely produce better performance at the expense of increasing the complexity of the circuit or increasing the number of instructions in a microprocessor.

Finally, a time constant "96" of the feedback loop is defined as the time that it takes for delta time measurement to be approximately 70% of the output of the adder 250. Depending on the application, it may be desirable to have a fast time constant or a slow time constant. By adjusting the gain factor A, a desired time constant can be obtained.

The time constant "$\tau$" is expressed as follows:

$$\tau = N * \Delta CR \quad (1)$$

where $\Delta CR$ is the interval between clock references and N is as expressed as follows:

$$N = \log(0.297)/\log(1-A) \quad (2)$$

N is the number of clock references which must be received before the contribution of the previous VCO control signals decays to 0.297 of its original value (1−1/e), where e is the base natural logarithm. Thus, if A is equal to 0.0625 and $\Delta CR$ is equal to 0.099 seconds, then the time constant is approximately 1.86 seconds. Similarly, if A is equal to 0.25 and $\Delta CR$ is equal to 0.101 seconds, then the time constant is approximately 0.43 seconds. Thus, it is possible to adjust the gain factor "A" values in Table 1 to produce the desired time constant as required for a particular application.

Figure 3:
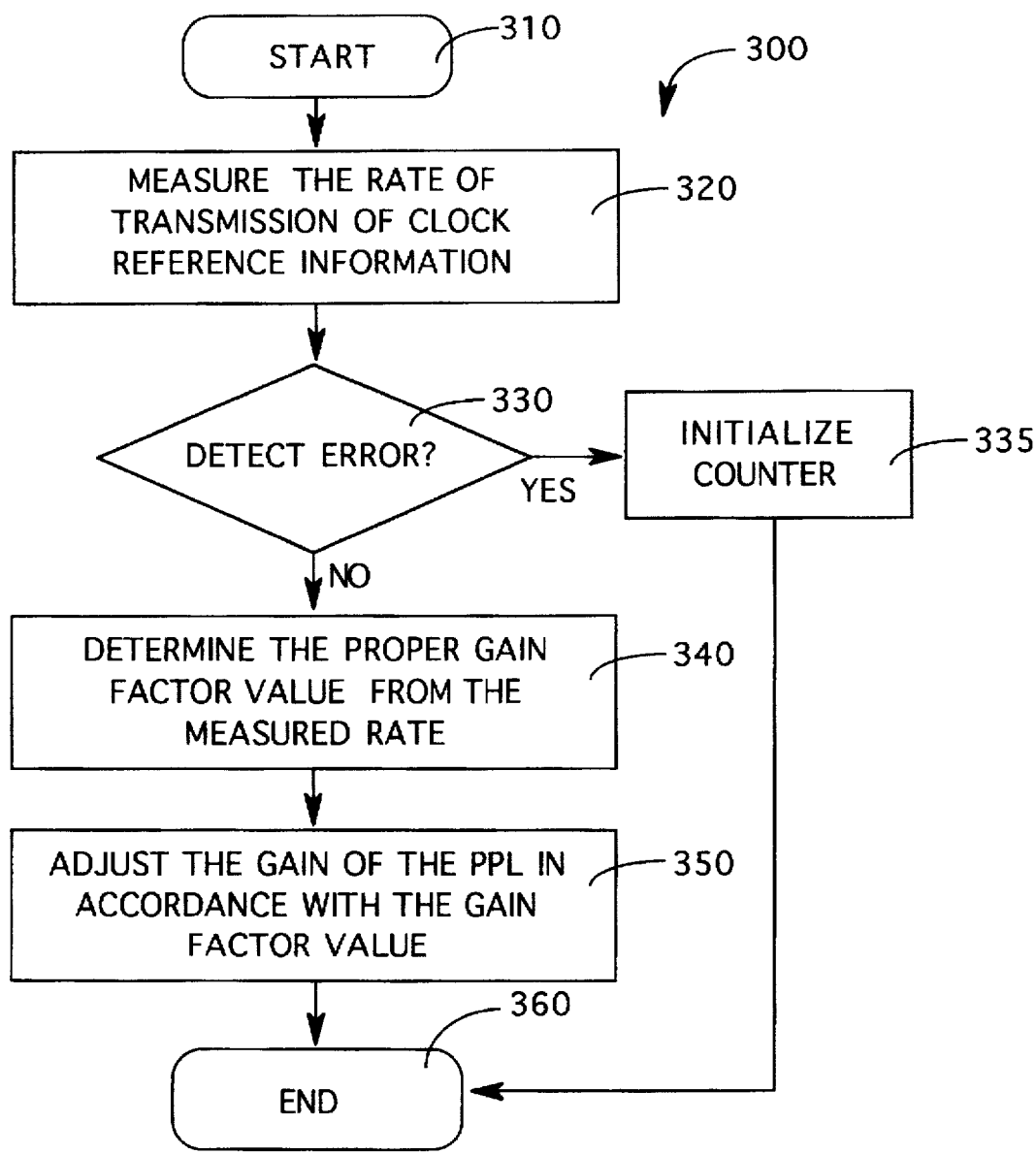
FIG. 3 illustrates a flowchart of a method for adjusting the parameters of a PLL.

FIG. 3 illustrates a method 300 for adjusting the parameters of a PLL. More specifically, method 300 adjusts the gain factor values of gain sections 240 and 245 of FIG. 1.

Method 300 begins at step 310 and proceeds to step 320 where the rate of transmission of clock reference information is determined. The transmission rate is determined by measuring the time interval ($\Delta CR$) between successive PCRs or by computing $\Delta CR$ from the difference of the PCR values.

In step 330, method 300 determines whether an error is detected from the measured $\Delta CR$. An error or discontinuity occurs if $\Delta CR$ is less than zero seconds or greater than a maximum upper time interval specified by the specific format of the bitstream. If the query is negatively answered, method 300 proceeds to step 340. If the query is affirmatively answered, method 300 proceeds to step 335 where the counter of the PLL control is initialized with the most recently received clock reference value.

In step 340, the measured $\Delta CR$ is applied to a plurality of predefined $\Delta CR$ ranges as illustrated in Table 1 to determine the proper gain factor values for gain sections 240 and 245. Once the proper gain factor values are determined, they are applied to gain sections 240 and 245 in step 350. Method 300 then ends in step 360.

There has thus been shown and described a novel method and apparatus for evaluating clock reference information from a data stream to adjust the gain of a PLL. Many changes, modifications, variations and other uses and applications of the subject invention will, however, become apparent to those skilled in the art after considering this specification and the accompanying drawings which disclose the embodiments thereof. All such changes, modifications, variations and other uses and applications which do not depart from the spirit and scope of the invention are deemed to be covered by the invention, which is to be limited only by the claims which follow.

What is claimed is:

1. An apparatus for achieving time synchronization in a communication system, said apparatus comprising:

a clock reference measure for measuring a varying transmission rate of clock reference values from a bitstream; and a Phase-Lock-Loop (PLL) circuit, coupled to said clock reference measure, where said measured transmission rate of clock reference values is used to adjust a gain factor of said PLL circuit.

2. The apparatus of claim 1, wherein said clock reference measure determines said measured transmission rate of clock reference values by measuring an arrival time between successive clock reference values in said bitstream.

3. The apparatus of claim 1, wherein said clock reference measure determines said measured transmission rate of clock reference values by computing a difference of successive clock reference values.

4. The apparatus of claim 1, wherein said PLL circuit comprises:

a difference section, for computing a delta time between each of said clock reference values from said bitstream and a clock reference value in said PLL circuit;

a first gain section, coupled to said difference section, for applying a gain factor "A" to said delta time;

a second gain section, for applying a gain factor "1-A" to a delayed control signal;

an adder, coupled to said first and second gain sections, for producing a control signal;

a delay, coupled to said adder, for applying a delay to said control signal to produce said delayed control signal; and a voltage-controlled oscillator (VCO), coupled to said adder, responsive to said control signal for adjusting an output frequency.

5. The apparatus of claim 4, wherein said PLL circuit further comprises a counter, coupled to said VCO, responsive to said output frequency to maintain a clock reference value of said PLL circuit.

6. The apparatus of claim 5, wherein said gain factor "A" is selected at 0.25 and gain factor "1-A" is selected at 0.75 if said measured transmission rate of clock reference values is less than 0.7 seconds.

7. The apparatus of claim 6, wherein said gain factor "A" is selected at 0.0625 and gain factor "1-A" is selected at 0.9375 if said measured transmission rate of clock reference values is less than 0.1 seconds.

8. The apparatus of claim 7, wherein said counter is initialized if said measured transmission rate of clock reference values is less than 0 seconds.

9. The apparatus of claim 5, wherein said gain factor "A" is adjusted to produce a desired time constant in accordance with $$\tau = N * \Delta CR$$

where $\tau$ is said desired time constant, $\Delta CR$ is said measured transmission rate of clock reference values and N is $N = \log(0.297)/\log(1-A)$.

10. A method of adjusting a gain parameter of a Phase-Lock-Loop (PLL), comprising the steps of:

(a) measuring a varying transmission rate of clock reference values from a bitstream;

(b) determining a gain factor from said measured transmission rate of clock reference values; and (c) adjusting the gain parameter of the PLL.

11. The method of claim 10, wherein said measuring step (a) comprises the step of measuring an arrival time between successive clock reference values in said bitstream.

12. The method of claim 10, wherein said measuring step (a) comprises the step of computing a difference from successive clock reference values.

13. The method of claim 10, wherein said determining step (b) comprises the step of applying said measured transmission rate of clock reference values to a plurality of predefined transmission rate levels.

14. The method of claim 10, wherein said gain parameter comprises a gain factor "A" and a gain factor "1-A".

15. The method of claim 14, wherein said adjusting step (c) comprises the step of changing the gain factors "A" and "1-A" in accordance with said measured transmission rate of clock reference values.

16. The method of claim 14, wherein said adjusting step (c) comprises the step of changing the gain factors "A" and "1-A" to modify a time constant in accordance with $$\tau = N * \Delta CR$$

where $\tau$ is said desired time constant, $\Delta CR$ is said measured transmission rate of clock reference values and N is $N = \log(0.297)/\log(1-A)$.

* * * * *

UNITED STATES PATENT AND TRADEMARK OFFICE
CERTIFICATE OF CORRECTION

PATENT NO. : 5,767,746
DATED : June 16, 1998
INVENTOR(S) : Dieterich

It is certified that error appears in the above-indentified patent and that said Letters Patent is hereby corrected as shown below:

On the title page, item [73] Assignee, should read -- David Sarnoff Research Center, Inc. and Sharp Corporation Princeton, N.J. --

Signed and Sealed this

Twenty-third Day of November, 1999

*Attest:*

Q. TODD DICKINSON

*Attesting Officer*    *Acting Commissioner of Patents and Trademarks*

UNITED STATES PATENT AND TRADEMARK OFFICE
CERTIFICATE OF CORRECTION

PATENT NO. : 5,767,746

DATED : June 16, 1998

INVENTOR(S) : Charles Benjamin Dieterich

It is certified that error appears in the above-identified patent and that said Letters Patent is hereby corrected as shown below:

Title page, item [73],

Assignee:  David Sarnoff Research Center, Inc.
Princeton, N.J.;

Sharp Corporation
Nenri, Japan

This Certificate supercedes certificate of correction issued November 23, 1999.

Signed and Sealed this

Fourteenth Day of November, 2000

*Attest:*

Q. TODD DICKINSON

*Attesting Officer*        *Director of Patents and Trademarks*